(12) United States Patent
Shin et al.

(10) Patent No.: US 7,626,857 B2
(45) Date of Patent: Dec. 1, 2009

(54) CURRENT INDUCED MAGNETORESISTANCE DEVICE

(75) Inventors: Kyung-Ho Shin, Seoul (KR); Nguyen Thi Hoang Yen, Seoul (KR); Hyun-Jung Yi, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 144 days.

(21) Appl. No.: 11/718,389

(22) PCT Filed: Oct. 28, 2005

(86) PCT No.: PCT/KR2005/003606
§ 371 (c)(1),
(2), (4) Date: May 1, 2007

(87) PCT Pub. No.: WO2006/049407
PCT Pub. Date: May 11, 2006

(65) Prior Publication Data
US 2007/0296406 A1    Dec. 27, 2007

(30) Foreign Application Priority Data
Nov. 3, 2004    (KR) .................. 10-2004-0088959

(51) Int. Cl.
*G11C 11/00* (2006.01)
(52) U.S. Cl. ................... 365/158; 365/171; 365/173; 365/225.5; 365/243.5

(58) Field of Classification Search ................. 365/158, 365/171, 173, 225.5, 243.5
See application file for complete search history.

(56) References Cited

U.S. PATENT DOCUMENTS

| 5,889,640 | A |   | 3/1999  | Hayashi et al. |
| 6,083,632 | A |   | 7/2000  | Fujikata et al. |
| 6,638,774 | B2 | * | 10/2003 | Raberg ........................ 438/3 |
| 6,865,109 | B2 | * | 3/2005  | Covington .................. 365/173 |
| 7,006,337 | B2 | * | 2/2006  | Dieny et al. ................. 360/324 |
| 7,280,323 | B2 | * | 10/2007 | Sato et al. ................. 360/324.1 |
| 2004/0083881 | A1 |   | 5/2004  | Panek et al. |

FOREIGN PATENT DOCUMENTS

| JP | 9-306160    | 11/1997 |
| WO | 2004/083881 | 9/2004  |

* cited by examiner

*Primary Examiner*—Pho M. Luu
(74) *Attorney, Agent, or Firm*—Darby & Darby P.C.

(57) ABSTRACT

Provided is a current induced switching magnetoresistance device comprising a magnetic multilayer composed of a first ferromagnetic layer, a nonferromagnetic layer, and a second ferromagnetic layer, wherein the first ferromagnetic layer has an upper electrode, the second ferromagnetic layer pinned by an antiferromagnet, wherein the antiferromagnet contains a lower electrode at its lower part, and the second ferromagnetic layer is embedded with a nano oxide layer. It is preferable to have at least a part of the lower electrode in contact with the second ferromagnetic layer. The magnetoresistance device provides a lower critical current (Ic) for the magnetization reversal and has an increased resistance.

13 Claims, 4 Drawing Sheets

[Fig. 1]
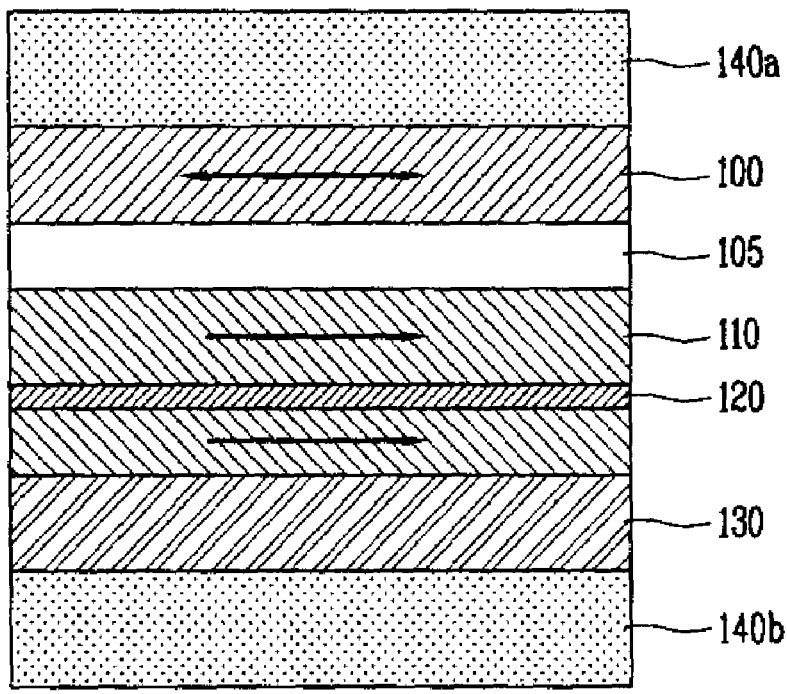
[Fig. 2]
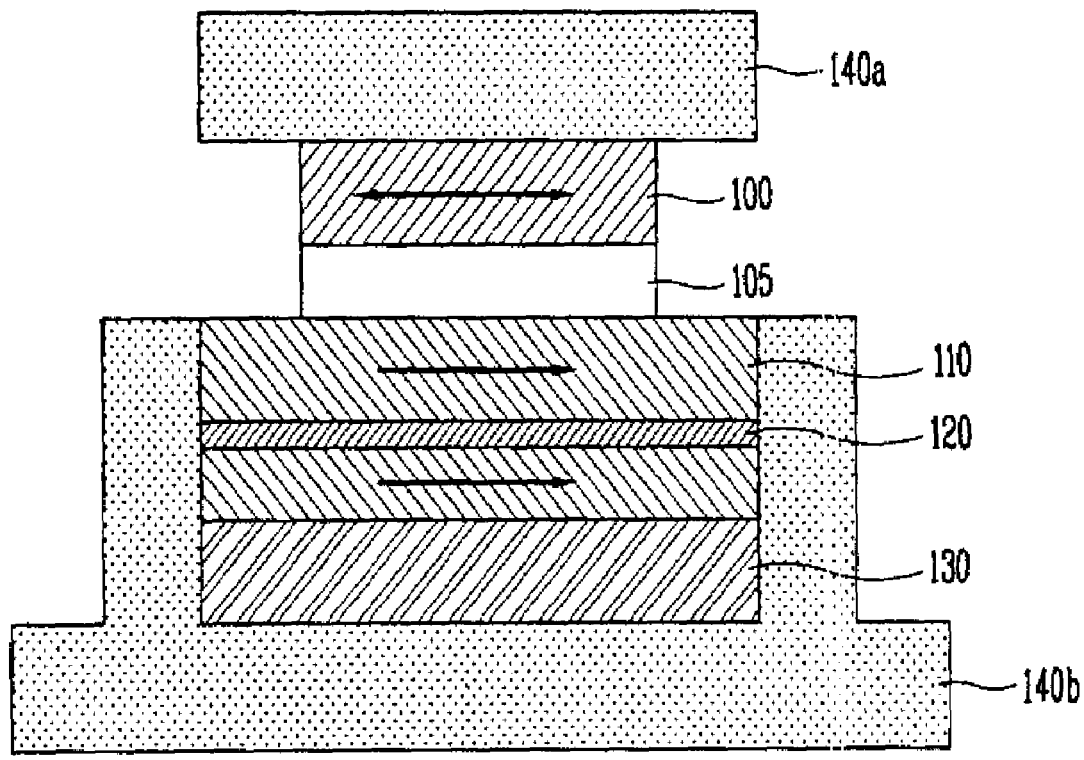

[Fig. 3]
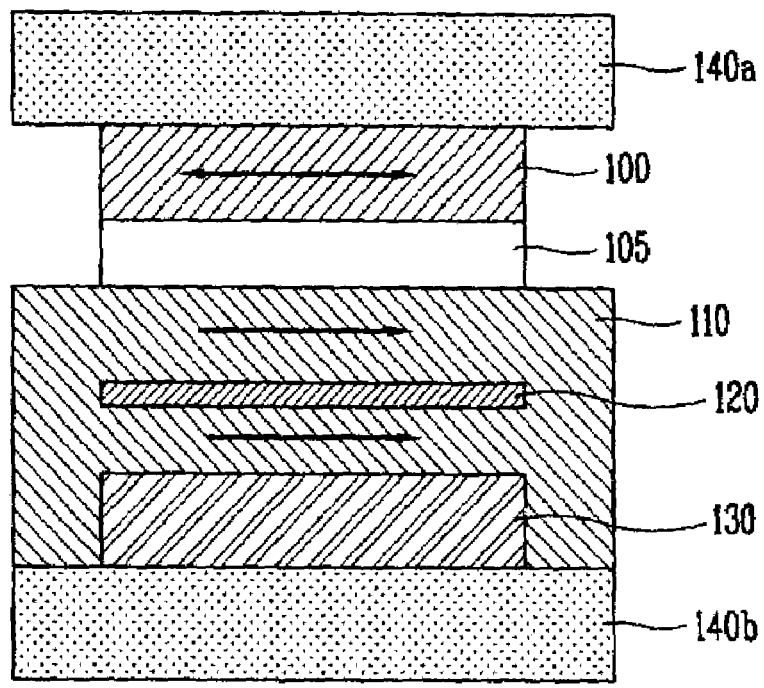
[Fig. 4]
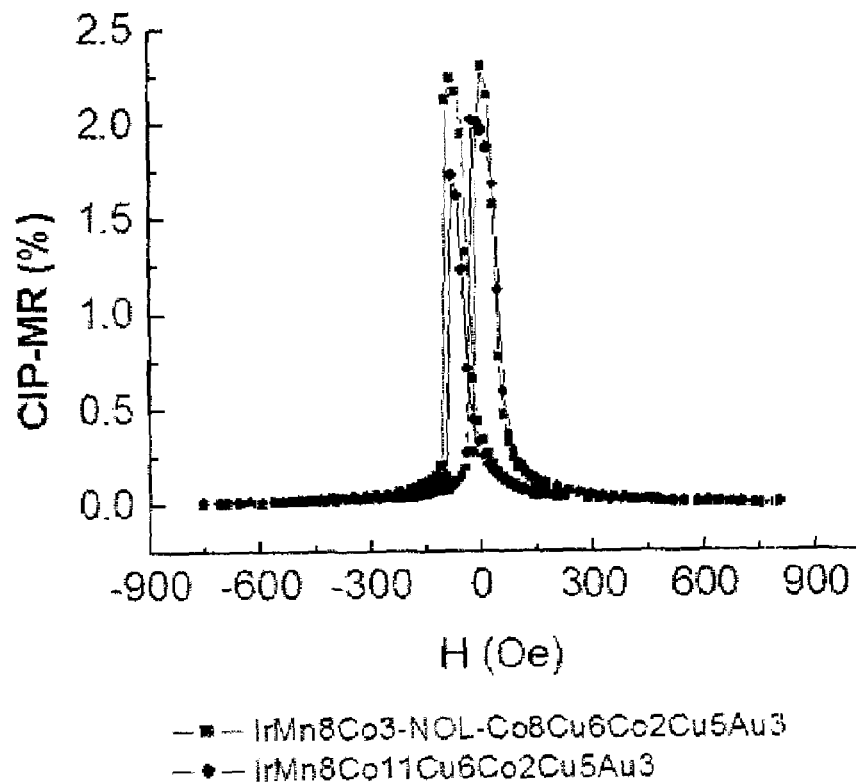

[Fig. 5]
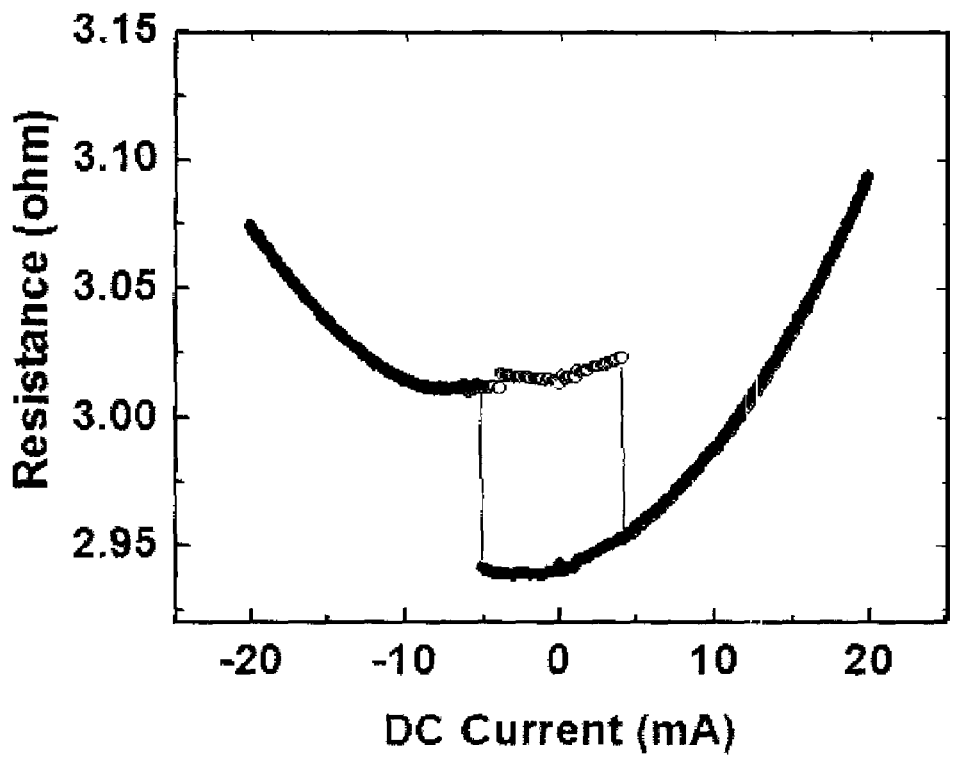
[Fig. 6]
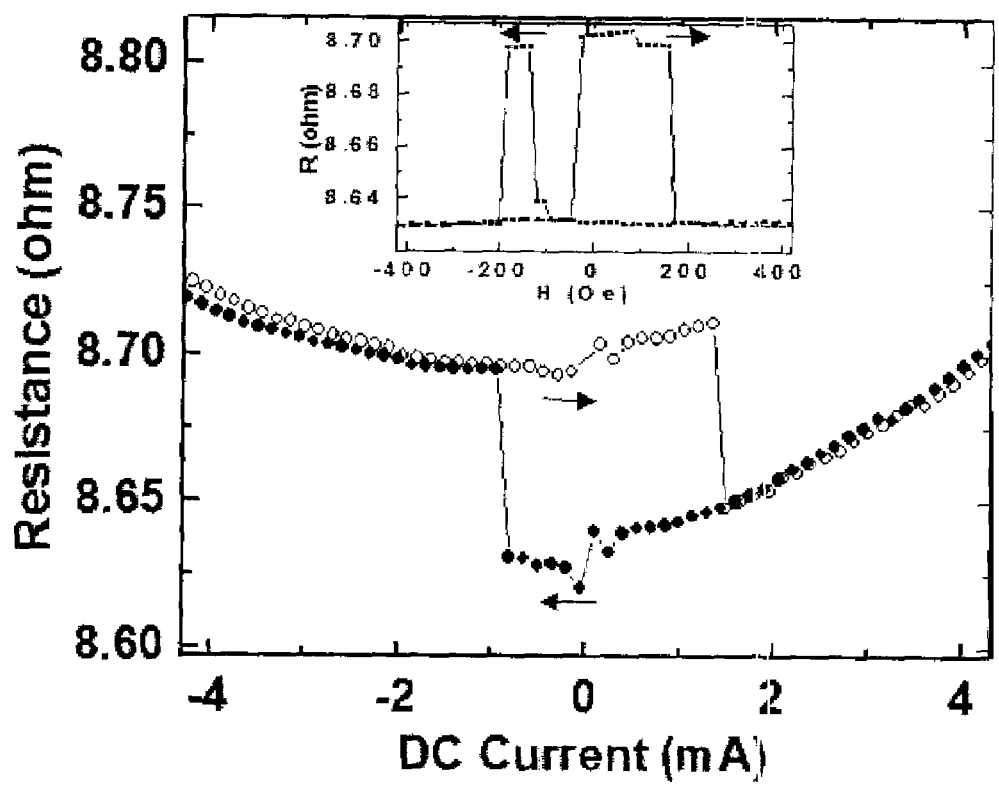

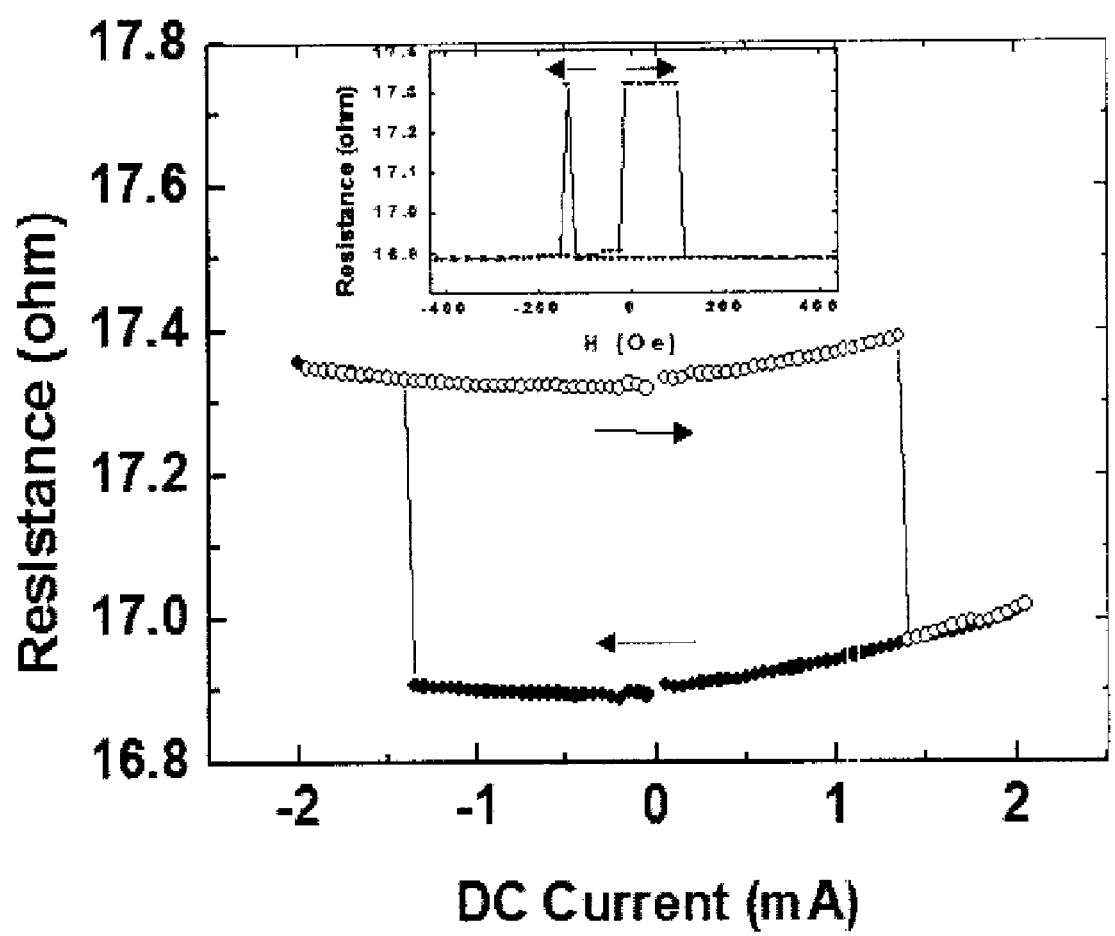
[Fig. 7]

CURRENT INDUCED MAGNETORESISTANCE DEVICE

This application is a U.S. national phase application under 35 U.S.C. §371 of International Patent Application No. PCT/KR2005/003506 filed Oct. 28, 2005, and claims the benefit of priority of Korean Patent Application No. 10-2004-0088959 filed Nov. 3, 2004. The International Application was published in English on May 11, 2006 as WO 2006/049407.

TECHNICAL FIELD

The present invention relates to a current induced magnetoresistance device, more particularly to a newly structured device that, by having an extended exchange biased pinned ferromagnetic thin film with an embedded nano-oxide layer, can be switched at lower current density and simultaneously provides an increasing change in absolute resistance at switching points.

BACKGROUND ART

Since a great magnetoresistance (GMR) was discovered in a ferromagnetic thin film, its application has been suggested to various fields. A typical application thereof is a magnetic random access memory (MRAM), which is a solid-state memory that can re-write and read recorded data many times by using magnetization direction of ferromagnets.

A unit cell in an MRAM has a multilayered ferromagnet-laminated structure. The relative alignment (being parallel or antiparallel) of the magnetization of the multilayers that consists the memory cell corresponds to "0" or "1" in binary data for recording. An MRAM has theoretically zero power consumption for maintaining data, and it corresponds to a non-volatile memory that can maintain the data even when the power is off.

The MRAMs utilize magnetoresistance devices which typically have a tri-layered structure of free-ferromagnet/spacer/fixed-ferromagnet. The spacer can be either an insulator, as in a magnetic tunnel junction (MTJ), or a non-magnetic metal, as in a spin valve. In those devices, the magnetic sensitivity and device's performance can be improved by adding a pinning layer, such as an antiferromagnet (AFM) or a synthetic antiferromagnet (SAF), adjacent to the fixed-ferromagnet to magnetically pin it in one direction.

Conventionally, data recording (writing process) is performed by reversing the magnetization direction of the free-ferromagnet through electromagnetic field generated by a current flow in a bit line and a word line, perpendicular to each other, and both parallel to the ferromagnet plane. This field-induced magnetization switching method exhibits an inherent disadvantage that the switching field, therefore the required current, is drastically increased with decreasing size of the cells. Furthermore, crosstalk between the adjoining lines and cells becomes serious when the cell-distance is small. These put a limitation on increasing the density of the magnetic memory device. In contrast, the current-induced magnetization switching (CIMS), a novel attractive alternative, allows to solve those problems. In the CIMS, a current flows perpendicular to plane of a ferromagnet can reverse its magnetization due to spin torque transferred from the spin-polarized conduction electrons to the magnet. The free-ferromagnet can be switched in parallel or antiparallel direction with the fixed ferromagnet when the current flows from the free to the fixed layers, or from the fixed to the free, respectively. In this mechanism, switching occurs when the current density reaches a critical value which is dependent on the spin-transfer efficiency of the current in that device. Therefore, in the same device structure, the smaller the size is, the lower switching current is required. However, there are two critical issues to be solved so that CIMS can be applied in real devices: the switching current density must be lowered and the output signal of the device must be increased.

SUMMARY OF THE INVENTION

In order to solve the above-mentioned critical issues, the present invention provides for a current-induced magnetization switching (CIMS) device comprising a multilayered laminated structure consisting of a first ferromagnetic layer, a nonmagnetic layer and a second ferromagnetic layer, wherein the first ferromagnetic layer contains an upper electrode, the second ferromagnetic layer pinned by an antiferromagnet and a lower electrode at the lower part of the antiferromagnet, and the nano-oxide layer is embedded in the second ferromagnetic layer.

Additionally, the present invention provides for a current-induced switching magnetoresistance device comprising a multilayered junctions consisting of a first ferromagnetic layer, a nonmagnetic layer and a second ferromagnetic layer, wherein the upper part of the first ferromagnetic layer contains an upper electrode, the second ferromagnetic layer is pinned with an antiferromagnet, a lower electrode at the lower part of the antiferromagnet, and the lower electrode is in contact with at least a part of the second ferromagnetic layer.

The CIMS device according to the present invention provides for a low critical switching current for the magnetization reversal and an increased resistance, thereby achieving an improved critical value, and therefore, the same device structure can be applied in various devices, especially in memory magnetoresistance devices.

The current induced magnetization direction of the CIMS device according to the present invention is preferably in perpendicular to each layer of the device and is in contact with at least a part of the second ferromagnetic layer.

The CIMS device of the present invention reverses the magnetization direction of the ferromagnetic layers, thereby exhibiting current-induced magnetization switching effect. Particularly, since reversing the magnetization of this structure is by a current perpendicular to the plane of layers, it has an advantage of improving the integration

BRIEF DESCRIPTION OF DRAWINGS

FIG. 1 is a sectional view of one embodiment of a current induced magnetoresistance switching device of the present invention.

FIG. 2 is a sectional view of another embodiment of current induced magnetoresistance switching device of the present invention.

FIG. 3 is a sectional view of yet another embodiment of current induced magnetoresistance switching device of the present invention.

FIG. 4 is a graph that shows the changes in the resistance of a current induced magnetoresistance switching device of the present invention with or without a nano oxide layer.

FIG. 5 is a graph that shows the current-voltage characteristic of a current induced magnetoresistance switching device having a simple spin-valve structure according to the present invention.

FIG. 6 is a graph that shows the current-voltage characteristic of a current induced magnetoresistance switching device without a nano oxide layer according to the present invention.

FIG. 7 is a graph that shows the current-voltage characteristic of a current induced magnetoresistance switching device that includes a nano oxide layer according to the present invention.

DETAILED DESCRIPTION OF THE INVENTION

FIG. 1 represents a sectional view of one embodiment of the CIMS according to the present invention. The first ferromagnetic layer (100) and the second ferromagnetic layer (110) are positioned between a nonmagnetic layer (105) which is consisted of a nonmagnetic material that acts as a spacer, thus forming a laminated structure. Such a laminated structure forms a magnetic tunnel junction (MTJ), and by depending on the magnetization direction of the two ferromagnetic layers, the current that tunnels through the nonmagnetic layer changes.

By exchange coupling through exchange bias, the antiferromagnet (130) in the second ferromagnetic layer (110) pins the magnetization direction of the second ferromagnetic layer (110) in one direction. By pinning the second ferromagnetic layer (110), the antiferromagnet (130) substantially maintains several magnetic domains inside the second ferromagnetic layer (110) as a single magnetic domain.

Unlike the second ferromagnetic layer (110), the magnetization direction of the first ferromagnetic layer (100) can be freely reversed, depending on the induced current. Therefore, the resistance to the magnetic device with the multilayered laminated structure can overall vary by induced current. In other words, the resistance of the device can be controlled by current.

The second ferromagnetic layer (110) includes therein a thin, preferably in nanometer thickness, nano-oxide layer (120). The nano-oxide layer (120) inhibits depolarization that is caused by the presence of antiferromagnet (130). The nano-oxide layer (120) acts as a kind of a mirror with respect to electrons so that it promotes the spin-dependent sputtering caused by the specular reflecting of conductive electrons. Accordingly, GMR effect of the device can be increased.

A device having such structure decreases the critical current (Ic) at which the magnetization reversal occurs and increases the magnetic resistance as well, so that its applicability to memory devices can be improved. Reference numerals 140a and 140b represent the upper electrode and the lower electrode, respectively.

FIGS. 2 and 3 show sectional views of another embodiment of the present invention. In FIG. 2, although this embodiment is similar to the embodiment of FIG. 1 in terms of having a laminated structure, this embodiment shows that the lower electrode (140b) is in contact with at least a part of the second ferromagnetic layer (110). Such structure makes electrons flow smoothly and avoids conduction electrons from getting resistance by the antiferromagnet (130). Since the lower electrode (140b) is in contact with the second ferromagnetic layer (110), the most of the current flows through the second ferromagnetic layer (110) rather than through the lower electrode (140b). Therefore, the critical current (Ic) can be further decreased.

FIG. 3 shows a structure where the second ferromagnetic layer (110) is extended to the surface of the lower electrode. The most of current in this structure also flows through the second ferromagnetic layer (110) rather than through the lower electrode (140b).

The current induced switching magnetoresistance devices can be manufactured by using standard semiconductor processes. Particularly, reactive ion beam technology can be used for forming the laminated structure. However, there are no special manufacturing limitations that are required, and a variety of conventional thin-film processes could be used.

The present invention will be further illustrated by the following examples in order to provide a better understanding of the invention. However, the present invention is not limited to the examples, and particularly, other materials that are within the technical effect of the present invention can be used for the composition of the layers.

EXAMPLE

After preparing the first ferromagnetic layer and the second ferromagnetic layer using cobalt (Co) thins films of 2 nm and 11 nm in thicknesses respectively, the nonmagnetic layer of copper thin film of 6 nm in thickness to be pinned between the ferromagnetic layers was prepared. After forming the first ferromagnetic layer such that it is thinner than the second ferromagnetic layer, an antiferromagnet was formed using IrMn thin film of 8 nm in thickness through exchange coupling at the lower part of the second ferromagnetic layer. In addition, an oxide layer of less than 5 Å was formed when forming the second ferromagnetic layer. The upper part and the lower part of the laminated structure were formed with copper (Cu) electrode of 5 nm respectively, and the lower part of the electrode was formed such that at least a part of the second ferromagnetic layer is in contact with the electrode.

In order to compare the magnetoresistance device of the present invention, a device without a nano-oxide layer embedded and a simple spin-valve structured magnetoresistance device were also prepared using the same materials as the magnetoresistance device of the present invention. FIG. 4 shows the changes in the resistance of the magnetoresistance device of the present invention depending on the presence/non-presence of the nano-oxide layer. According to FIG. 4, the nano-oxide layer could induce an increase in the resistance change of 20%.

Conclusively, the resistance was increased due to the presence of nano-oxide layer.

To confirm the magnetoresistance and the critical current of the device, the current-voltage characteric by the Four-Point Probe was measured. FIG. 5 shows the current-voltage characteristic of a simple spin-valve, FIG. 6 shows the current voltage characteristic of a magnetoresistance device without nano oxide layer, and FIG. 7 shows the current-voltage characteristic of a magnetoresistance device with nano oxide layer. The following Table 1 compares the results of the critical current (Ic) and the magnetoresistance ratio ($\Delta R/R$) of each of the devices.

TABLE 1

| Type of Structure | Critical Current (Ic) | Magnetoresistance Ratio ($\Delta R/R$) |
|---|---|---|
| Simple Spin-Valve (without anti-ferromagnetic layer) | $3.5 \sim 2.4 \times 10^7$ A/cm$^2$ | 2.5~2.7% |
| Nano oxide layer excluded; Electrode is not in contact with the second ferromagnetic layer | $1.6 \times 10^8$ A/cm$^2$ | 0.36% |
| Nano oxide layer excluded; Electrode is in contact with the second ferromagnetic layer | $7.5 \times 10^6$ A/cm$^2$ | 0.75% |
| Nano oxide layer included; Electrode is in contact with the second ferromagnetic layer | $9.4 \times 10^6$ A/cm$^2$ | 2.5% |

As shown in Table 1, even though the Simple Spin-Valve System neither contains the nano oxide layer nor the antiferromagnet for the exchange bias and has a high magnetoresistance ratio, it has a disadvantage of having the critical current too high. When the antiferromagnetic layer was neither in contact with the second ferromagnetic layer nor had a nano-oxide layer, the results still showed an increased critical current and a poor magnetoresistance. However, by having the electrode in contact with the second ferromagnetic layer, the critical current was significantly lowered, and furthermore, by including a nano-oxide layer, the magnetoresistance was also improved.

The invention claimed is:

1. A current induced switching magnetoresistance device comprising:
    a multilayered structure consisted of a first ferromagnetic layer, a non-ferromagnetic layer and a second ferromagnetic layer;
    an upper electrode provided in the first ferromagnetic layer;
    an antiferromagnet pinned at the second ferromagnetic layer; and
    a lower electrode at the lower part of the antiferromagnet, wherein the second ferromagnetic layer is embedded with a nano oxide layer;
    wherein the magnetization direction of the first ferromagnetic layer can be switched depending on the current induced, and the magnetization direction of the second ferromagnetic layer can be fixed by the antiferromagnetic layer.

2. The current induced switching magnetoresistance device of claim 1, wherein the lower electrode is in contact with at least a part of the second ferromagnetic layer.

3. The current induced switching magnetoresistance device of claim 1, characterized in that the second ferromagnetic layer is thicker than the first ferromagnetic layer.

4. The current induced switching magnetoresistance device of claim 1, wherein the nano oxide layer has a thickness between 1 to 5 Å.

5. The current induced switching magnetoresistance device of claim 1, wherein the current flows perpendicular to the plane of the layers.

6. A magnetic memory apparatus using the current induced switching magnetoresistance device of claim 1.

7. A current induced switching magnetoresistance device comprising:
    a multilayered structure including a first ferromagnetic layer, a non-ferromagnetic layer under the first ferromagnetic layer and a second ferromagnetic layer under the non-ferromagnetic layer;
    an upper electrode on the first ferromagnetic layer;
    an anti-ferromagnetic layer under the second ferromagnetic layer; and
    a lower electrode under the antiferromagnet layer,
    wherein the lower electrode is in contact with at least a part of the second ferromagnetic layer, and wherein the second ferromagnetic layer includes a nano oxide layer.

8. The current induced switching magnetoresistance device of claim 7, wherein the second ferromagnetic layer is thicker than the first ferromagnetic layer.

9. The current induced switching magnetoresistance device of claim 7, wherein the nano oxide layer has a thickness between 1 to 5 Å.

10. The current induced switching magnetoresistance device of claim 7, wherein a current induced in the perpendicular direction to the multilayered structure.

11. The current induced switching magnetoresistance device of claim 7, wherein the magnetization direction of the first ferromagnetic layer is reversed depending on a current induced and the magnetization direction of the second ferromagnetic layer is pinned by the anti-ferromagnetic layer.

12. The current induced switching magnetoresistance device of claim 7, wherein the nano oxide layer inhibits depolarization that is caused by the presence of the anti-ferromagnetic layer.

13. A magnetic memory apparatus using the current induced switching magnetoresistance device of claim 7.

* * * * *